(12) United States Patent
Yaguchi et al.

(10) Patent No.: US 12,170,184 B2
(45) Date of Patent: Dec. 17, 2024

(54) TRANSMISSION ELECTRON MICROSCOPE AND INSPECTION METHOD USING TRANSMISSION ELECTRON MICROSCOPE

(71) Applicant: Hitachi High-Tech Corporation, Tokyo (JP)

(72) Inventors: Toshie Yaguchi, Tokyo (JP); Keiji Tamura, Tokyo (JP); Hiromi Mise, Tokyo (JP); Yasuyuki Nodera, Tokyo (JP); Akiko Wakui, Tokyo (JP); Keisuke Igarashi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 494 days.

(21) Appl. No.: 17/594,658

(22) PCT Filed: Apr. 26, 2019

(86) PCT No.: PCT/JP2019/017938
§ 371 (c)(1),
(2) Date: Oct. 25, 2021

(87) PCT Pub. No.: WO2020/217456
PCT Pub. Date: Oct. 29, 2020

(65) Prior Publication Data
US 2022/0244201 A1    Aug. 4, 2022

(51) Int. Cl.
*H01J 37/26* (2006.01)
*G01N 23/20* (2018.01)
*H01J 37/295* (2006.01)

(52) U.S. Cl.
CPC ............ *H01J 37/26* (2013.01); *G01N 23/20* (2013.01); *H01J 37/265* (2013.01);
(Continued)

(58) Field of Classification Search
None
See application file for complete search history.

(56) References Cited

U.S. PATENT DOCUMENTS

2007/0196266 A1\* 8/2007 Richards ............... B01J 21/10
423/635
2021/0233741 A1\* 7/2021 Harada ................. H01J 37/04

FOREIGN PATENT DOCUMENTS

JP    60-105150 A    6/1985
JP    60-150548 A    8/1985

OTHER PUBLICATIONS

International Search Report (PCT/ISA/210) issued in PCT Application No. PCT/JP2019/017938 dated Jul. 9, 2019 with English translation (two (2) pages).

(Continued)

*Primary Examiner* — Eliza W Osenbaugh-Stewart
(74) *Attorney, Agent, or Firm* — Crowell & Moring LLP

(57) ABSTRACT

A transmission electron microscope capable of obtaining a hollow-cone dark-field image and visually displaying irradiation conditions thereof includes an irradiation unit for irradiating a specimen with an electron beam, an objective lens for causing the electron beam transmitted through the specimen to form an image, beam deflectors positioned higher than a position where the specimen is placed, an objective movable aperture for passing only a portion of the electron beam transmitted through the specimen, and a deflection coil control unit. The deflection coil control unit controls a deflection angle of the electron beam using the beam deflectors such that the specimen is irradiated with the electron beam at a predetermined angle with respect to an optical axis while the electron beam is moving in a precessional manner and only a diffracted wave and/or a scattered wave having a desired angle passes through the objective movable aperture.

12 Claims, 13 Drawing Sheets

(52) U.S. Cl.
CPC ...... *H01J 37/295* (2013.01); *G01N 2223/418* (2013.01); *H01J 2237/0458* (2013.01); *H01J 2237/1507* (2013.01); *H01J 2237/2802* (2013.01)

(56) References Cited

OTHER PUBLICATIONS

Japanese-language Written Opinion (PCT/ISA/237) issued in PCT Application No. PCT/JP2019/017938 dated Jul. 9, 2019 (three (3) pages).
H. Tsukasaki, et al., "Direct observation of a non-isothermal crystallization process in precursor $Li_{10}GeP_2S_{12}$ glass electrolyte", Journal of Power Sources 369 (2017) pp. 57-64.

* cited by examiner

FIG. 6
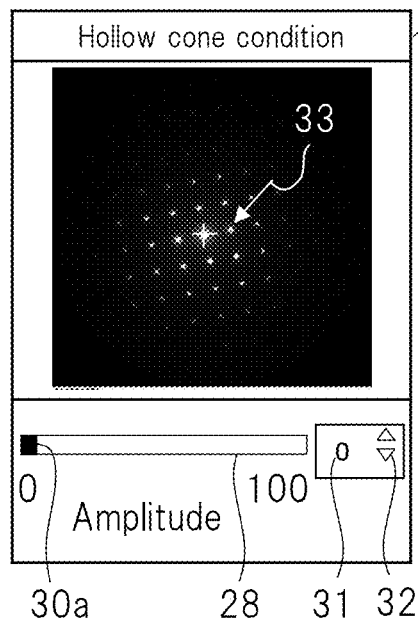
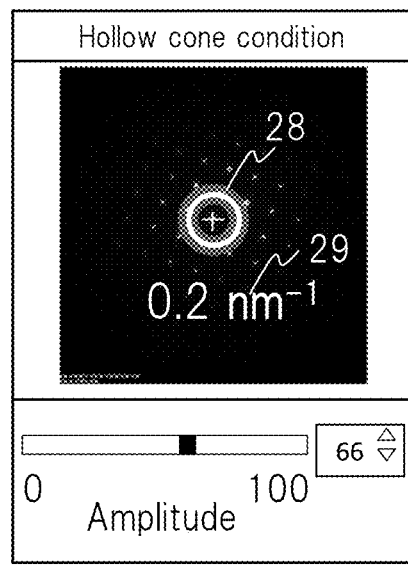
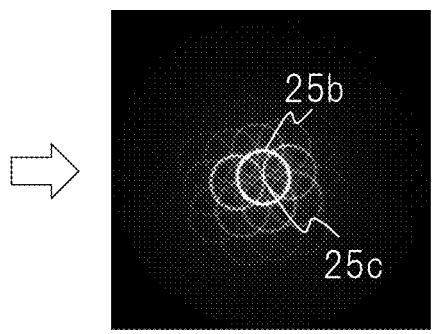
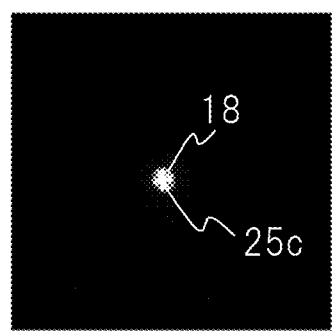
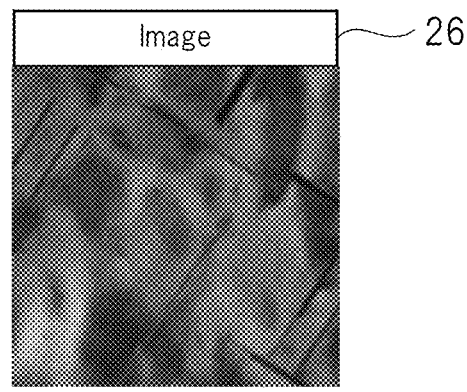

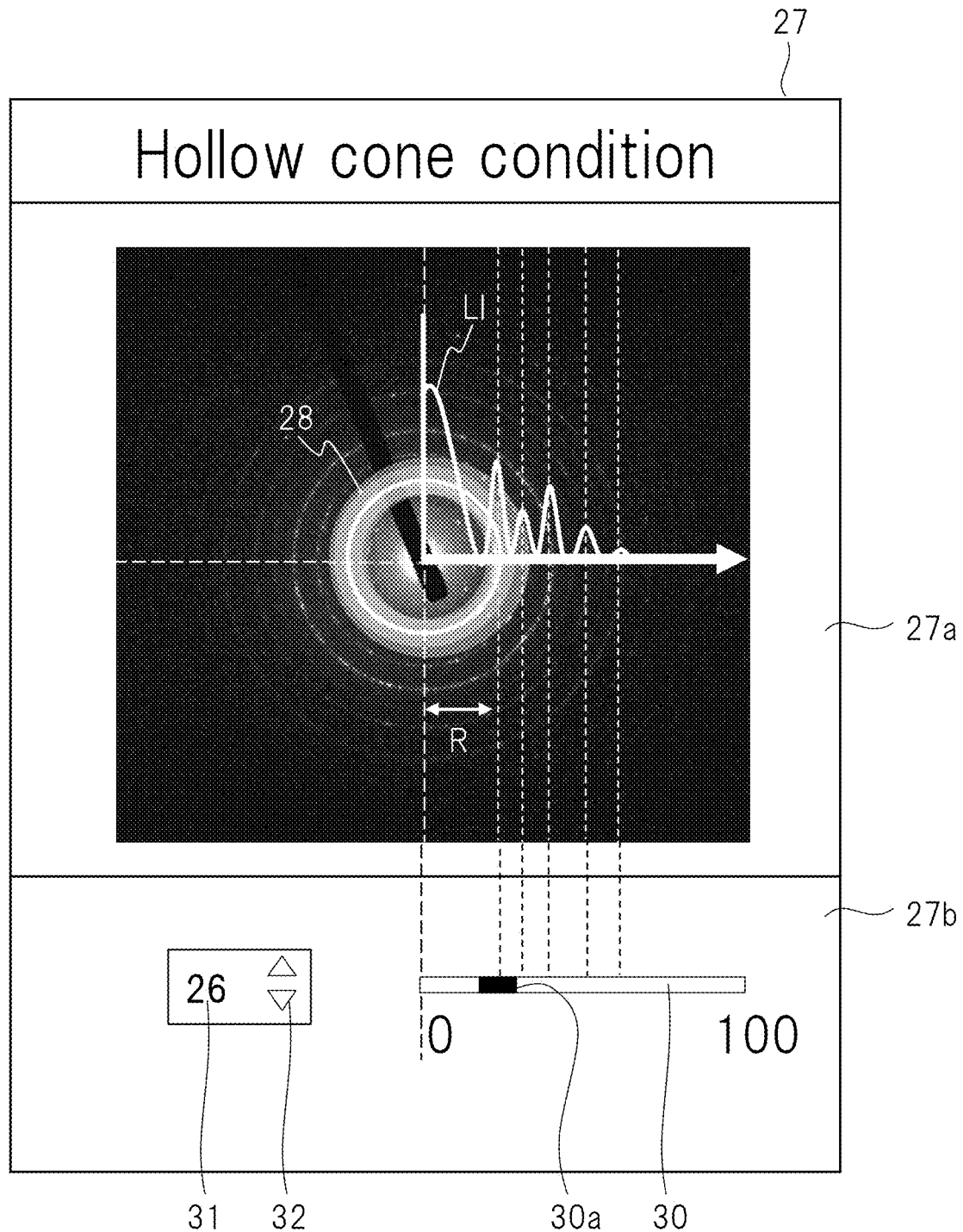

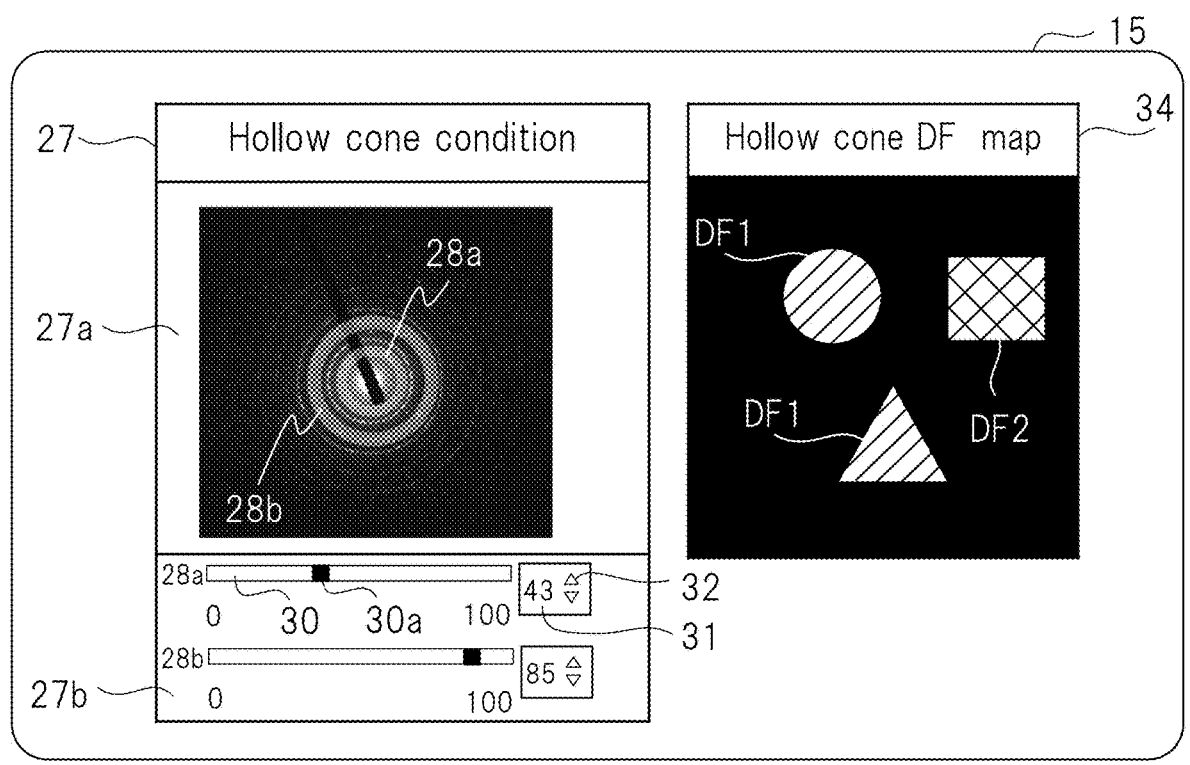

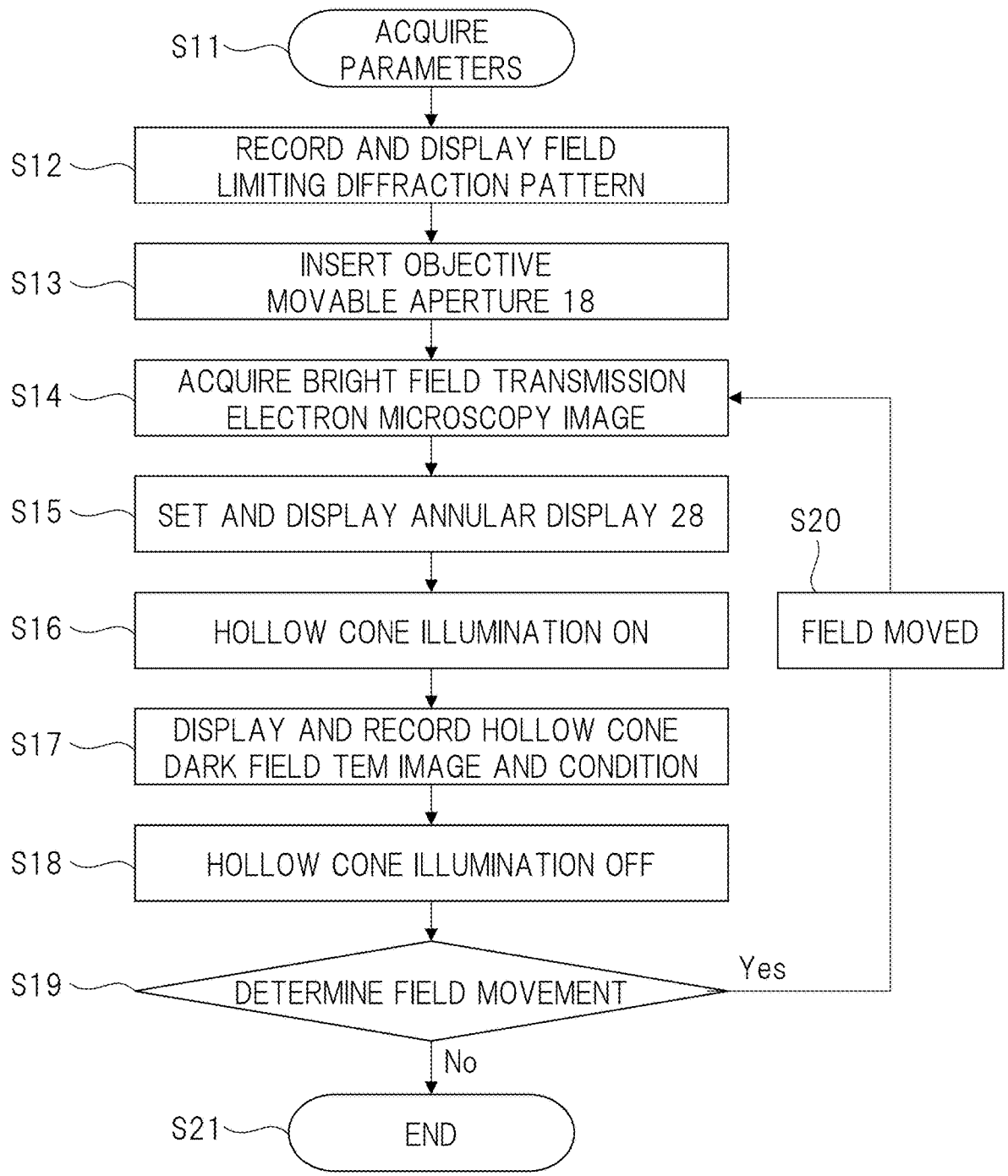

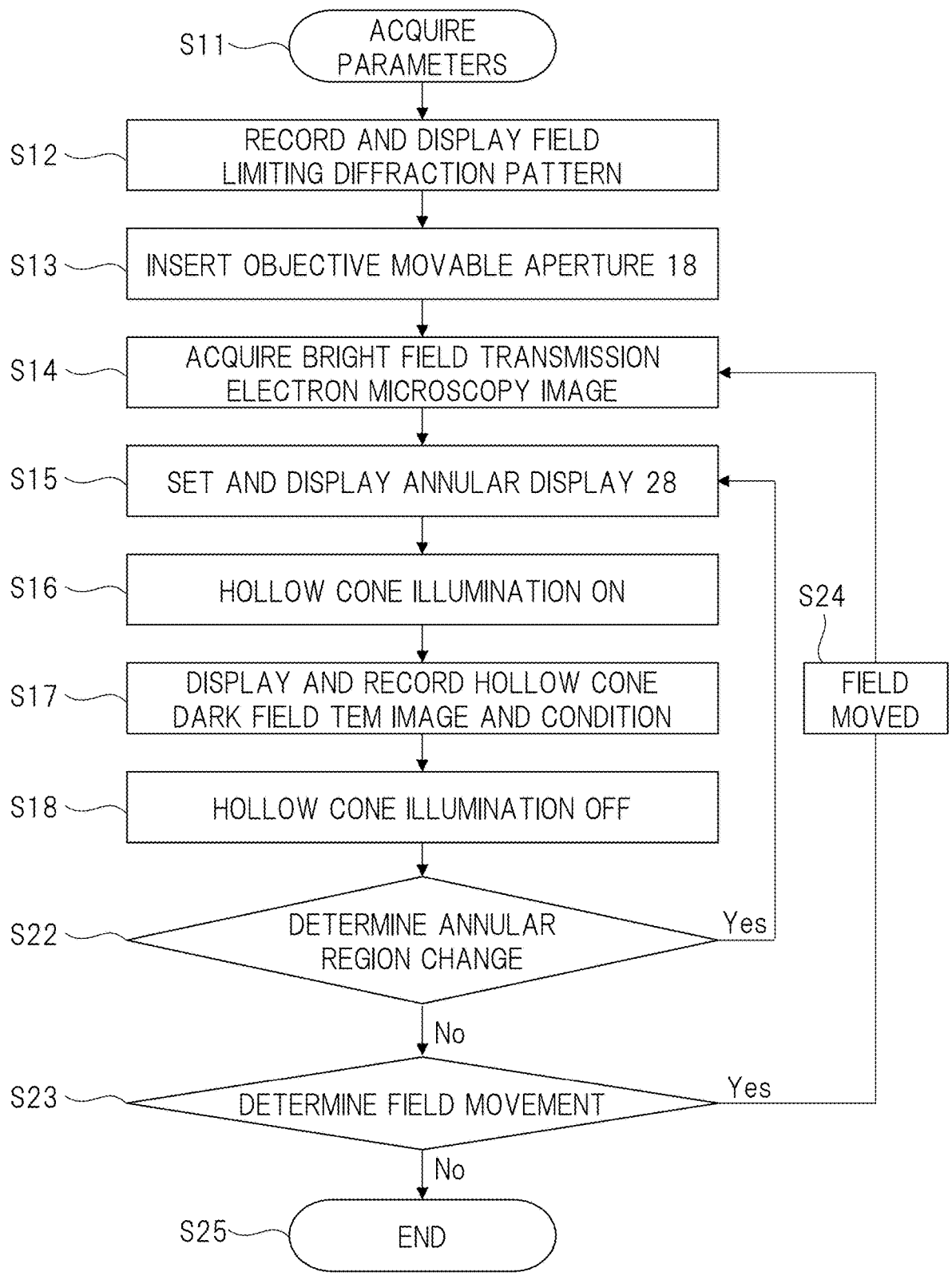

TRANSMISSION ELECTRON MICROSCOPE AND INSPECTION METHOD USING TRANSMISSION ELECTRON MICROSCOPE

TECHNICAL FIELD

The present invention relates to a transmission electron microscope and an inspection method using the transmission electron microscope, and can be particularly suitably used for a transmission electron microscope capable of performing hollow cone illumination.

BACKGROUND ART

A transmission electron microscope (TEM) is used for fine structure observation of various devices, measurement of a film thickness of a multilayer film, or the like. In the TEM, an electron beam is illuminated at a sufficiently high acceleration voltage in order to transmit a sample.

With miniaturization of a structure to be measured and the like, for example, it is required to measure or observe a substance made of a light element such as a silicon oxide film or a silicon nitride film by the TEM. When the acceleration voltage is high, contrast of the light element in a TEM image is unclear, and it is difficult to determine the contrast. Therefore, a technique is known in which, when the silicon oxide film or the silicon nitride film is measured or observed, the contrast is increased by lowering the acceleration voltage.

On the other hand, there is also a need to observe a crystal size and a shape of a film made of a heavy element. When the heavy element is measured or observed, the acceleration voltage is often increased.

In order to check the crystal size and crystal orientation of a target structure, there is a dark field transmission electron microscopy method using the electron beam diffracted or scattered in a sample. In the dark field transmission electron microscopy method, by using a desired diffracted or scattered electron, a portion where the selected diffraction and/or scattering occurs in an observation field is observed with a bright contrast. The dark field transmission electron microscopy method is also used for evaluation of a metals alloy film or the like or evaluation of crystallinity of a battery material.

For example, Non-Patent Literature 1 discloses a technique for observing a process in which a state of crystallization of an electrolyte material of a lithium (Li) battery is changed depending on a change in temperature by superimposing a dark field TEM image of a diffraction spot scattered at the same angle.

CITATION LIST

Non-Patent Literature

Non-Patent Literature 1: H. Tsukasaki et al. Journal of Power Sources 369 (2017) 57-64

SUMMARY OF INVENTION

Technical Problem

In Non-Patent Literature 1, since a dark field TEM image is recorded for each scattered diffraction spot, and the obtained images are integrated, it is difficult to perform dynamic observation in real time. Since a scattering angle and a diffraction angle are fixed at the time of observation of the TEM image, when the diffraction angle of the electron beam is changed due to the structural change, an observation mode of the dark field TEM image is once changed to a diffraction pattern observation mode, resetting is executed such that the corresponding diffraction spot enters an objective aperture, and the mode is returned to the observation mode of the dark field TEM image. Therefore, since a procedure increases, it is difficult to follow the dynamic change. Since the dark field transmission electron microscopy images at a plurality of scattering angles are observed and recorded, much time may be required.

An object of the present application is to provide a transmission electron microscope capable of obtaining a hollow cone dark field TEM image. Other technical problems and novel characteristics will be apparent based on a description of the description and drawings.

Solution to Problem

A brief overview of typical embodiments disclosed in the present application is as follows.

A transmission electron microscope according to an embodiment includes: an irradiation unit configured to irradiate a sample with an electron beam; an objective lens configured to form an image of the electron beam transmitted through the sample; a beam deflector that is located above a position at which the sample is to be positioned and that is configured to deflect the electron beam; an objective aperture configured to pass only a part of the electron beam transmitted through the sample; and a first control unit. Here, the first control unit controls a deflection angle of the electron beam by the beam deflector such that the sample is irradiated while the electron beam precesses at a predetermined angle with respect to an optical axis, and that only a diffracted wave and/or a scattered wave at a desired angle among diffracted waves and/or scattered waves generated by the electron beam passing through the sample passes through the objective aperture.

BRIEF DESCRIPTION OF DRAWINGS

FIG. 6 shows a display screen corresponding to the flowchart in FIG. 5.

FIG. 7 shows an example of the display screen according to the first embodiment.

FIG. 8C shows an example of the display screen according to the first embodiment.

FIG. 10 is a flowchart showing the inspection method using the transmission electron microscope according to the first embodiment.

FIG. 11 is a flowchart showing the inspection method using the transmission electron microscope according to the first embodiment.

DESCRIPTION OF EMBODIMENTS

Figure 1:
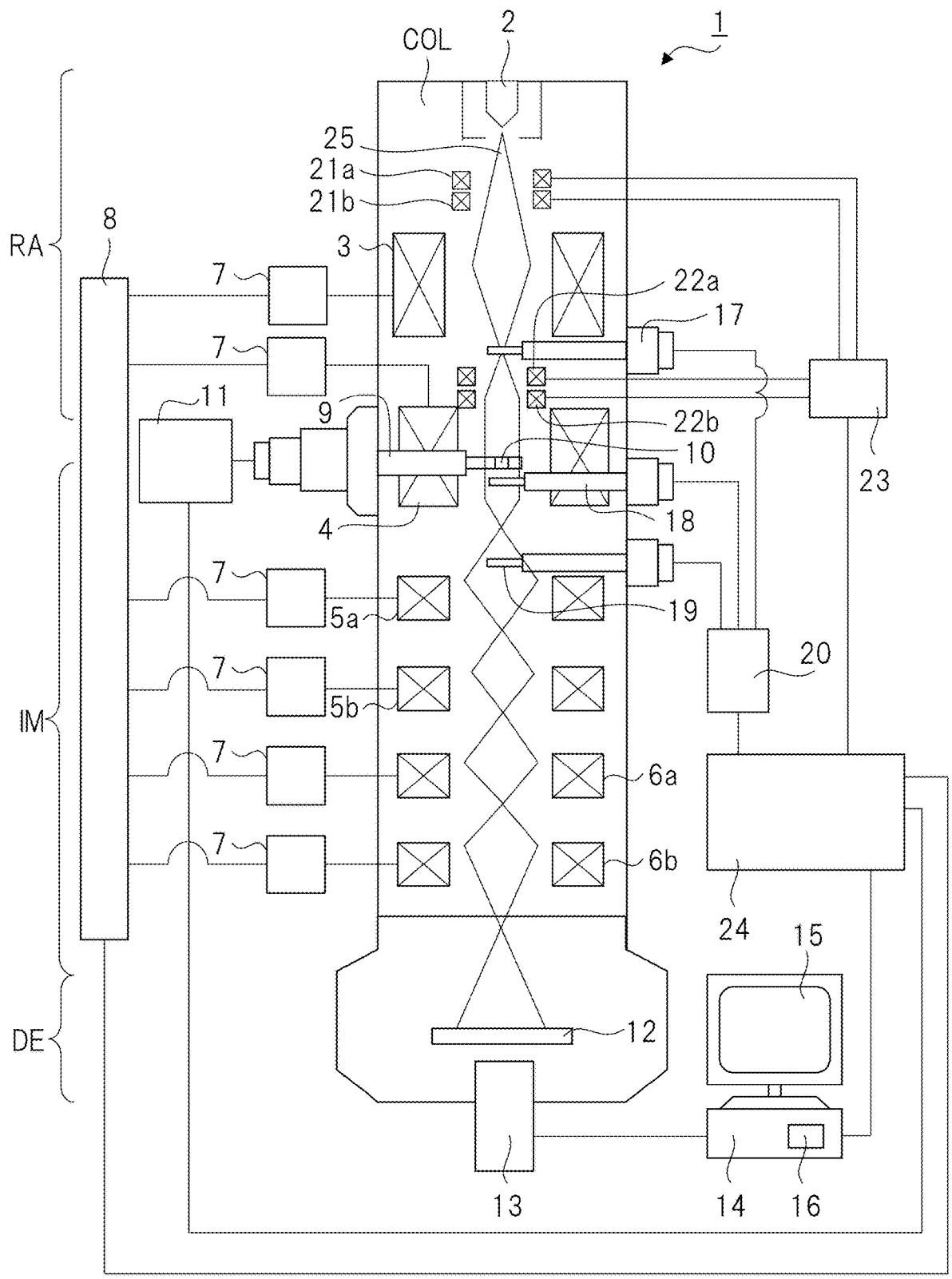
FIG. 1 is a schematic view showing a transmission electron microscope according to a first embodiment.

Hereinafter, an embodiment will be described in detail with reference to the drawings. In all the drawings showing the embodiment, members having same functions are denoted by same reference numerals, and repetitive description thereof will be omitted. In the following embodiment, description of the same or similar portion will not be repeated in principle unless necessary.

In the following description, a term "upper" or "lower" indicates an upper side or a lower side with reference to each drawing, and does not necessarily coincide with a vertically upward direction or a vertically downward direction.

First Embodiment

FIG. 1 is a schematic view showing a basic structure of a transmission electron microscope 1 which is an example of a charged particle beam device. However, it should be noted that the illustrated configuration is merely an example.

The transmission electron microscope 1 includes a column COL. The column COL is mainly divided into an irradiation unit RA that irradiates a sample with an electron beam, an image-forming unit IM that forms an image of the electron beam, and a detection unit DE that detects the electron beam.

The irradiation unit RA mainly includes an electron gun 2 serving as a discharge source (electron source) of electrons (beams), beam deflectors 21a, 21b, 22a, and 22b, and a condenser lens 3. The image-forming unit IM mainly includes an objective lens 4, intermediate lenses 5a and 5b and projector lenses 6a and 6b that form an image of transmission electron beams transmitted through a sample 10. The detection unit DE mainly includes a fluorescent plate 12 that is a member that emits light by being irradiated with the electron beams. Power (current, voltage) is supplied to each lens from a lens excitation power supply 7. Each lens is coupled to a lens power supply control unit 8 via the lens excitation power supply 7.

A condenser movable aperture 17 is provided below the condenser lens 3. An objective movable aperture 18 is provided on a back focal plane of the objective lens 4. A field limiting movable aperture 19 is provided on an image plane of the objective lens 4. Each of the condenser movable aperture 17, the objective movable aperture 18, and the field limiting movable aperture 19 is movable in and out at least on an optical axis. Whether each movable aperture is to be placed in the optical axis is determined according to an observation target, an observation purpose, or the like. Each of the movable apertures 17, 18, and 19 is movable two-dimensionally (in a horizontal direction) or three-dimensionally, and is, for example, a motor drive. Positions of the movable apertures 17, 18, and 19 are controlled by a movable aperture control unit 20.

A beam deflector (coil) of one or more stages is provided below the electron gun 2 and preferably above the condenser lens 3. FIG. 1 illustrates a case in which two-stage beam deflectors 21a and 21b are provided. Further, the beam deflector (coil) of one or more stages is provided above a sample holder 9, that is, between the condenser lens 3 and the objective lens 4. FIG. 1 illustrates a case in which two-stage beam deflectors 22a and 22b are provided. Each of the beam deflectors 21a, 21b, 22a, and 22b is electrically coupled to a deflection coil control unit 23. Although it is also possible to provide the beam deflectors 22a and 22b above the condenser lens 3, in the first embodiment, the beam deflectors 22a and 22b are provided below the condenser lens 3.

In the first embodiment, the sample holder 9 is inserted into the column COL such that the sample 10 is located inside the objective lens 4. When the sample 10 is inspected, the sample 10 is mounted on the sample holder 9, and a position of the sample 10 is controlled by a sample micromotion control unit 11.

The fluorescent plate 12 is provided below a projector lens 6b. As an additional or alternative configuration in the detection unit DE, the transmission electron microscope 1 may include a camera 13. In FIG. 1, the camera 13 is located below the fluorescent plate 12. The camera 13 is electrically coupled to a display unit 15 via an image control unit 14 that displays and records an image.

In the transmission electron microscope 1 according to the first embodiment, the display unit 15 can be provided inside or outside the transmission electron microscope 1. For example, the display unit 15 may be integrally coupled to the inside of the transmission electron microscope 1, or may be electrically coupled to the outside of the transmission electron microscope 1.

The image-formed transmission image is enlarged by the intermediate lenses 5a and 5b and the projector lenses 6a and 6b, and is projected onto the fluorescent plate 12. When the fluorescent plate 12 is removed (for example, lifted) from the optical axis, the transmission image is projected onto the camera 13. As a result, the transmission image is displayed on the display unit 15. The transmission image acquired by the camera 13 is recorded by the image control unit 14 electrically coupled to the detection unit DE (the fluorescent plate 12 and the camera 13). That is, a dark field transmission electron microscopy image is generated in the image control unit 14 based on a detection signal of a diffracted wave diffracted at a predetermined angle in the detection unit DE.

The transmission image may be recorded in an image storage device 16 provided in the image control unit 14. The image storage device 16 is a hard disk, a flash memory, or the like.

Each of the lens power supply control unit 8, the sample micromotion control unit 11, the image control unit 14, the movable aperture control unit 20, and the deflection coil control unit 23 is electrically coupled to a microprocessor 24 that controls the entire transmission electron microscope 1. In FIG. 1, in order to make the description easy to understand, each control unit is individually illustrated near a relevant control target, whereas each control unit and the microprocessor 24 may be integrated as one control unit. Therefore, in the present application, the control unit including all or a part of the lens power supply control unit 8, the sample micromotion control unit 11, the image control unit 14, the movable aperture control unit 20, the deflection coil control unit 23, and the microprocessor 24 may be simply referred to as a "control unit".

The electron beam 25 generated from the electron gun 2 is illuminated to the sample 10 while an irradiation region of the electron beams is limited by the condenser lens 3 and the condenser movable aperture 17. The electron beam 25 transmitted through the sample 10 is image-formed by the objective lens 4.

Here, when the sample 10 is a crystalline sample, an electron beam that travels straight without being diffracted and an electron beam that is diffracted by the crystal are present. A TEM image formed under a condition that only the electron beam that travels straight without being diffracted passes through the objective movable aperture 18 is referred to as a bright field transmission electron microscopy image. When the electron beam 25 is made perpendicular by the beam deflector 22a and a region centered on the optical axis of the sample 10 is irradiated by the beam deflector 22b so that only the straight travelling electron beam passes through the objective movable aperture 18, the bright field transmission electron microscopy image is formed.

On the other hand, the electron beam diffracted at the same angle is gathered at the same point on the back focal plane of the objective lens 4, and as a result, an electron beam diffraction pattern is formed on the back focal plane. When the electron beam 25 is inclined by the beam deflector 22a such that only the diffracted electron beam 25 passes through the objective movable aperture 18 and is swung back so as to irradiate the same place of the sample 10 by the beam deflector 22b, a dark field transmission electron microscopy image is formed. In the case of an amorphous sample, an image is formed not by the diffracted electron beam but by the scattered electron beam.

When the electron beam diffraction pattern is observed, the field limiting movable aperture 19 is inserted. The electron diffraction pattern of a transmission image region formed on the image plane of the objective lens 4 limited by the field limiting movable aperture 19 is formed on the back focal plane of the objective lens 4. The diffraction pattern of the electron beam can be observed by focusing the intermediate lenses 5a and 5b on the diffraction pattern and enlarging the diffraction pattern on the intermediate lenses 5a and 5b and the projector lenses 6a and 6b such that the diffraction pattern is projected onto the fluorescent plate 12 or the camera 13.

To acquire a bright field transmission electron microscopy image, a dark field transmission electron microscopy image, a hollow cone dark field TEM image, or a diffraction pattern, an instruction is issued from the microprocessor 24 to each control unit (the lens power supply control unit 8, the sample micromotion control unit 11, the image control unit 14, the movable aperture control unit 20, and the deflection coil control unit 23). When an image or a pattern is acquired, each condition is recorded in the image control unit 14, the image is displayed, and the image is recorded.

Figure 2:
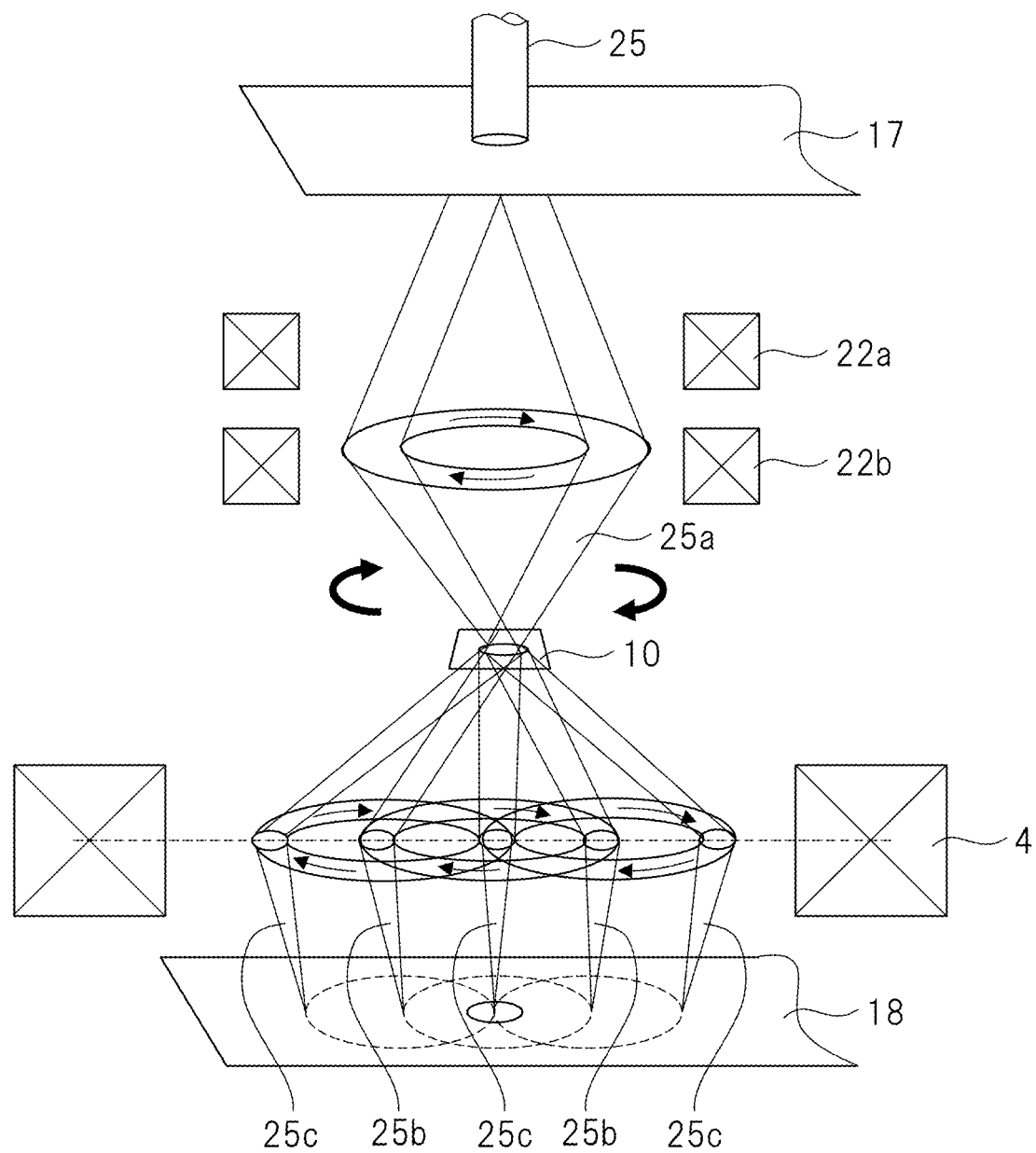
FIG. 2 is an explanatory diagram showing a hollow cone illumination method using the transmission electron microscope according to the first embodiment.

FIG. 2 is an explanatory diagram showing a hollow cone illumination method using the transmission electron microscope 1. The electron beam 25 formed by the condenser lens 3 passes through the condenser movable aperture 17 and reaches the beam deflector. Here, when a sine wave current having a phase different by 90 degrees is supplied to the upper portion 22a and the lower portion 22b of the beam deflector, the electron beam 25 precesses due to the combination of the upper and lower currents or the magnetic fields generated by the currents. By appropriately selecting the condition of the precession, the electron beam 25 is illuminated along a hollow cone having a surface at which the sample 10 is located as an apex. In the first embodiment, such illumination is described as hollow cone illumination.

Accordingly, the electron beam 25a inclined at the same angle with respect to the optical axis passes through the objective movable aperture 18. That is, the deflection coil control unit 23 controls a deflection angle of the electron beam 25 by the beam deflectors 22a and 22b such that the sample 10 is irradiated while the electron beam 25a precesses at a predetermined angle with respect to the optical axis, and only the diffracted wave and/or a scattered wave at a desired angle among the diffracted wave and/or the scattered wave generated by the electron beam 25a passing through the sample 10 passes through the objective movable aperture 18.

When the crystalline sample 10 is observed with the electron beam 25a, on the back focal plane of the objective lens 4, the transmission electron beam 25b that travels straight without being diffracted in the sample 10 rotates in a ring shape around the optical axis. On the other hand, the electron beam 25c diffracted in the sample 10 rotates in a ring shape around a position slightly separated from the optical axis. A rotation radius of the electron beams 25b and 25c on the back focal plane of the objective lens 4 changes depending on a radius of the precession of the electron beam 25a before entering the sample 10.

The radius of the precession changes depending on an amount of current (here, since a sine wave is applied, the amount of current may be referred to as an amplitude) flowing through the beam deflectors 22a and 22b. Therefore, in a state in which the objective movable aperture 18 is inserted on the optical axis, a hollow cone dark field TEM image is obtained by changing the amount of current flowing through the beam deflectors 22a and 22b such that a part of the ring of the specific diffracted wave passes through an optical axis center.

Figure 3A:
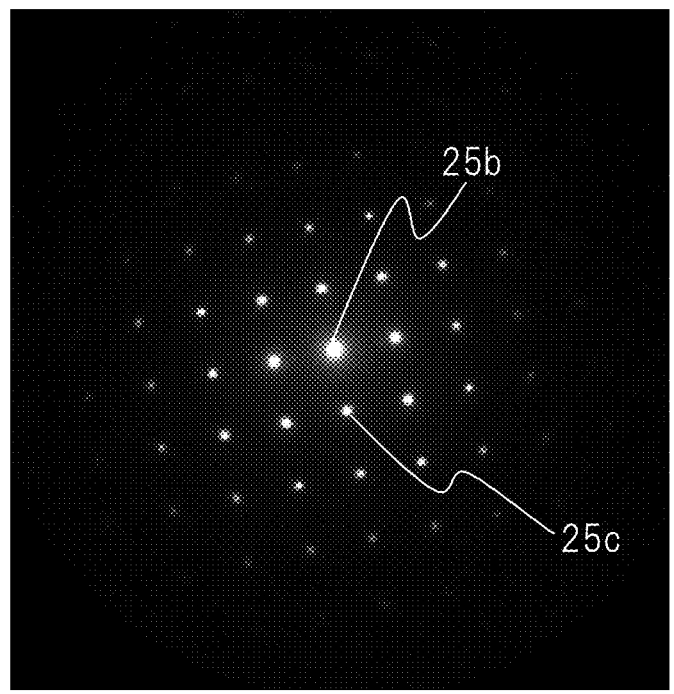
FIG. 3A is an explanatory diagram showing a selected area diffraction pattern obtained using the transmission electron microscope according to the first embodiment.
Figure 3B:
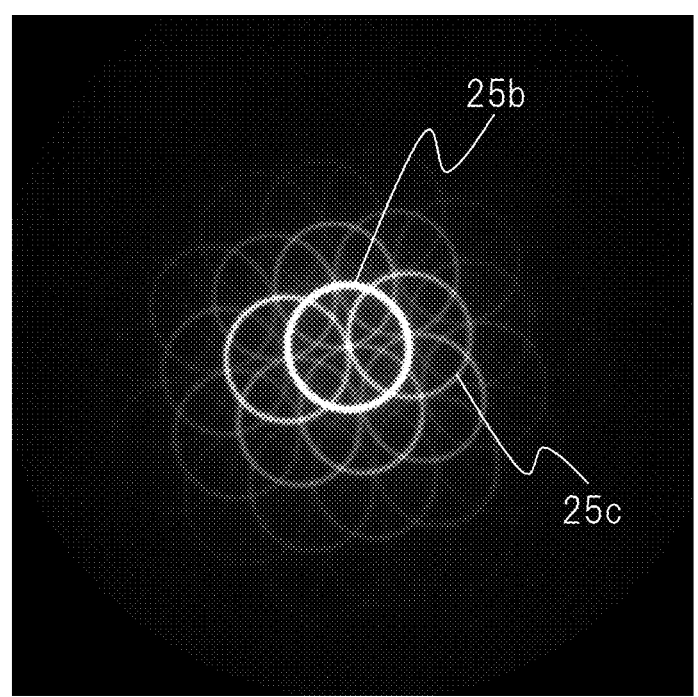
FIG. 3B is an explanatory diagram showing a hollow cone beam diffraction pattern obtained using the transmission electron microscope according to the first embodiment.

FIG. 3A shows the selected area diffraction pattern in a case in which a single crystal of gold is used as the sample 10. FIG. 3B shows a hollow cone beam diffraction pattern obtained by setting an inclination angle of the precession such that the diffraction pattern of a (111) plane of the gold is in contact with the optical axis center. As described with reference to FIG. 2, since the electron beam 25 rotates under the condition that the pattern in FIG. 3B is obtained, the diffraction pattern at a certain momentary time is shown as a single diffraction spot in a strict sense. Therefore, the ring-shaped diffraction pattern in the first embodiment is described as an aggregate of a plurality of diffraction spots rotated at least one time around the optical axis within a certain period of time.

In FIG. 3A, the transmission electron beam 25b that travels straight without being diffracted in the sample 10 rotates in the ring shape around the optical axis in the hollow cone beam illumination shown in FIG. 3B. Similarly, the electron beam 25c diffracted from a crystal plane also rotates in the ring shape around the optical axis. As described above, in FIG. 3B, the inclination angle of the precession is set such that the electron beam 25c (the electron beam corresponding to the diffracted wave from the (111) plane of the gold) passes through the optical axis center. In FIG. 3A, the electron beam 25c is shown only on the diffraction spot on the lower portion of the electron beam 25b. However, in this example, a diffraction spot adjacent to the electron beam 25b in the upper portion, a left portion, and a right portion of the electron beam 25b is also equal to (equivalent to) the electron beam 25c.

When the objective movable aperture 18 is inserted into the optical axis center at the time of hollow cone illumination, a diffraction spot group equidistant from the optical axis passes through the objective movable aperture 18. At this time, the straight travelling transmission electron beam 25b, that is, the brightest electron beam 25b does not pass through the objective movable aperture 18. Therefore, in the dark field transmission electron microscopy image generated by the hollow cone illumination, the contrast is emphasized by the weak electron beam 25c which is a diffraction spot group other than a main spot. A rotation period of the electron beam (precession) is determined so as to be at least one rotation during capturing of the dark field transmission electron microscopy image or the like.

Figure 4:
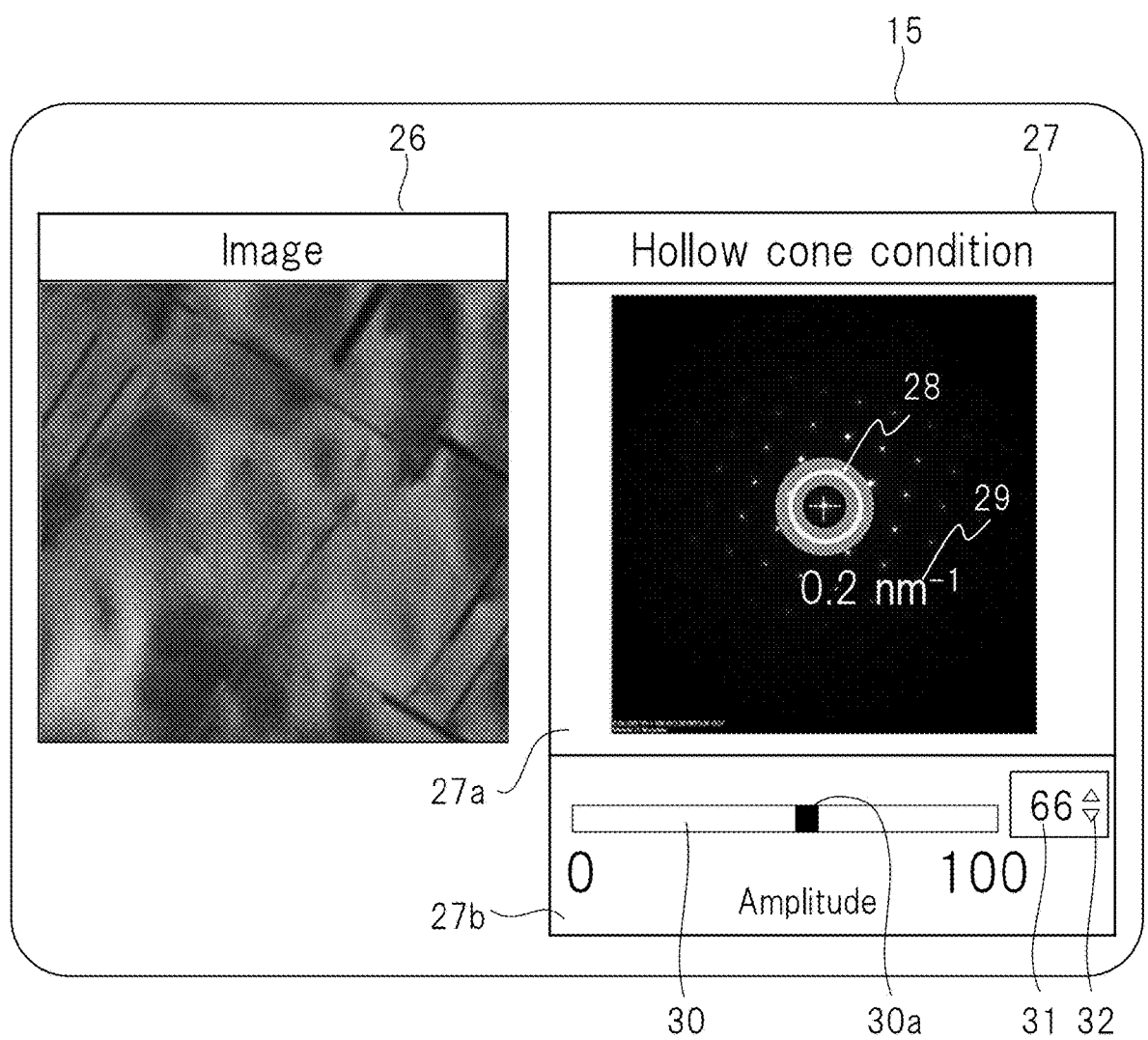
FIG. 4 shows an example of a display screen according to the first embodiment.

FIG. 4 shows an example of a display screen that displays a hollow cone dark field of the transmission electron microscope 1. Various conditions can be changed by operating each configuration displayed on the display unit 15.

In an image window 26 (indicated by "Image" in the drawing), the hollow cone dark field TEM image of the sample 10 is displayed. A hollow cone condition window 27 (indicated by "Hollow cone condition" in the drawing) corresponds to the image window 26 and includes a display unit 27a and a condition setting unit 27b. The diffraction pattern acquired in advance, a diffraction pattern model of a material input in advance, or a diffraction pattern of a standard sample input in advance is displayed on the display unit 27a. Various conditions for acquiring the dark field transmission electron microscopy image such as a ring scale display for each plane interval are displayed in the condition setting unit 27b, and the conditions can be operated.

The image window 26 and the hollow cone condition window 27 are interlocked with each other, and when the condition is changed in the condition setting unit 27b, the hollow cone dark field TEM image also changes in the image window 26 in conjunction with the change of the condition. As an example, the hollow cone condition window 27 displays the diffraction pattern (a pattern obtained by normal illumination instead of hollow cone illumination, or a pattern to be obtained) of the sample 10.

Figure 12:
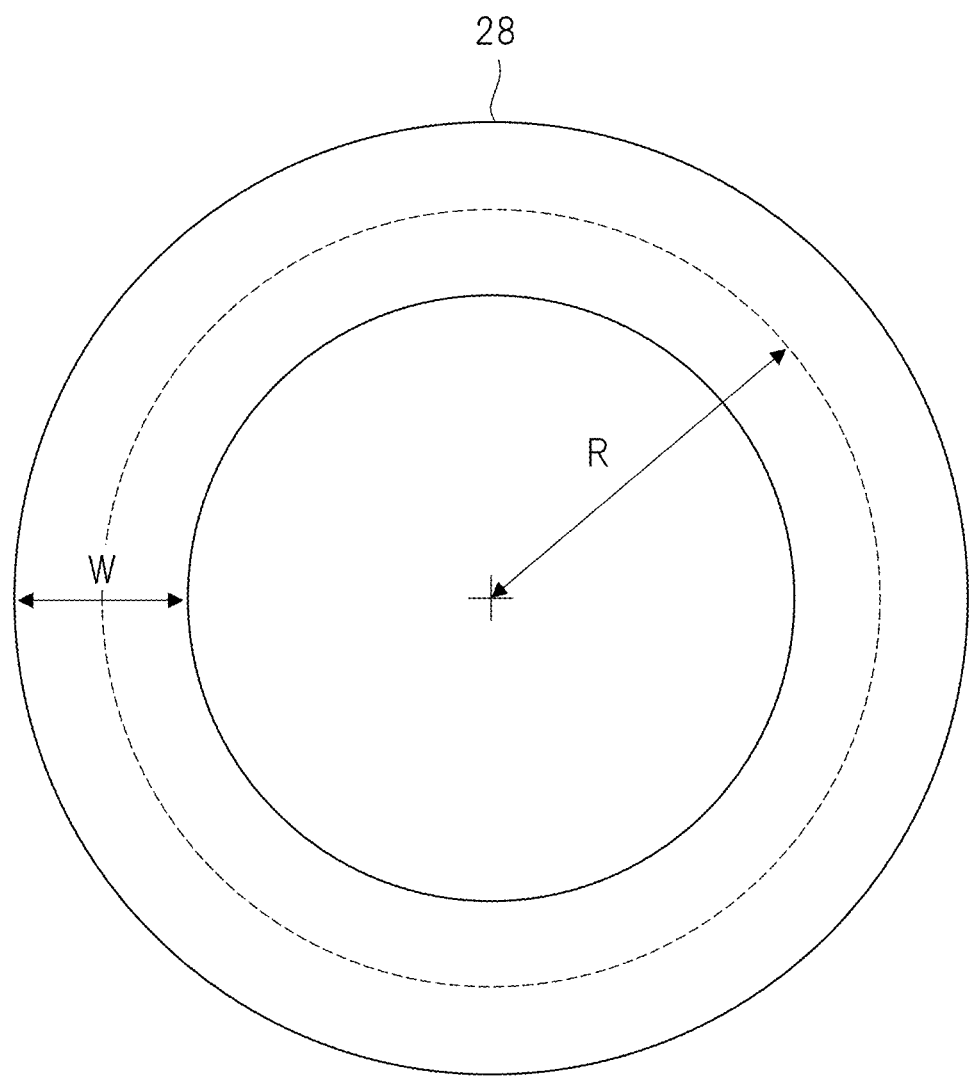
FIG. 12 is a diagram illustrating a width and a diameter of an annular display.

On the diffraction pattern displayed in the hollow cone condition window 27, a diffraction region and a scattering region used for generation of the hollow cone dark field TEM image are annularly displayed as an annular display 28. A region inside the annular display 28 is a region where the electron beam 25c passes through the objective movable aperture 18 when the hollow cone illumination is performed. Therefore, a width (a difference between an outer diameter and an inner diameter of the annular display 28) of the annular display 28 corresponds to a diameter of the objective movable aperture 18. When the diameter of the objective movable aperture 18 is changed, the width of the annular display 28 is also changed. Here, the "width of the annular display 28" refers to a length of a portion indicated by a reference numeral W shown in FIG. 12.

A diameter (radius) of the annular display 28 corresponds to a radius of a circle drawn by the electron beams 25b and 25c transmitted through the sample 10 by the hollow cone illumination. Here, the "diameter of the annular display 28" refers to a length of a portion indicated by a reference numeral R shown in FIG. 12. Ideally, the diameter R of the annular display 28 is a length from the optical axis to an intermediate point (intermediate line) between the outer diameter and the inner diameter of the annular display 28. The condition setting unit 27b of the hollow cone condition window 27 is provided with a scroll bar 30 that allows the diameter (radius) of the annular display 28 to be changed, a cursor 30a that designates a value in the scroll bar 30, a news box 31 that displays the value designated by the cursor 30a, and a button 32 that allows the value of the news box 31 to be directly changed.

The value specified here is the amount of current of the beam deflectors 22a and 22b, that is, the diameter of the annular display 28. In other words, by changing the diameter of the annular display 28 in the hollow cone condition window 27, it is possible to specify the electron beam (diffracted wave and/or scattered wave) in which region is used to generate the hollow cone dark field TEM image.

In the hollow cone condition window 27, the plane interval corresponding to an average radius of the diffraction and scattering regions is displayed as a plane interval display 29. The annular display 28, the plane interval display 29, the position of the cursor 30a of the scroll bar 30, a numerical value of the news box 31, and the button 32 are linked, and if any one of the position of the cursor 30a of the scroll bar 30, the numerical value of the news box 31, and the button 32 is changed, the other values are also changed in conjunction with one another. Therefore, for example, it is possible to automatically change the position of the cursor 30a of the scroll bar 30 and observe and record the hollow cone dark field TEM image corresponding to the position of the cursor 30a with a moving image.

As described above, the transmission electron microscope according to the first embodiment has a graphical user interface (GUI). The image window 26, the hollow cone condition window 27, the diffraction pattern, the annular display 28, the plane interval display 29, the scroll bar 30, the cursor 30a, the news box 31, the button 32, and the like as described above are provided in the graphical user interface. By using the graphical user interface, a user can visually and intuitively perform an operation on the display unit 15, and burden on the operation of the user can be reduced.

When the hollow cone dark field TEM image is observed while changing an acquisition condition of the dark field transmission electron microscopy image, the contrast of the dark field transmission electron microscopy image changes. For example, in the case in FIG. 4, when the diffraction spot or the scattered electron beam is included in the annular display 28, the corresponding region of the dark field transmission electron microscopy image becomes bright, and when the diffraction spot or the scattered electron beam is not included in the annular display 28, the corresponding region of the dark field transmission electron microscopy image becomes dark. What kind of dark field transmission electron microscopy image can be obtained also changes depending on which diffraction spot or scattered electron beam is included in the annular display 28. Therefore, it is possible to record a desired hollow cone dark field TEM image by stopping the cursor 30a when a desired contrast is obtained.

After the dark field transmission electron microscopy image is acquired while scanning (changing) the acquisition condition of the dark field transmission electron microscopy image, it may be obtained at what angle the precession (in other words, which electron beam diffraction or electron beam scattering region being used, or which length the diameter of the annular display) maximizes signal intensity of the entire dark field transmission electron microscopy image. As an addition or alternative, after the dark field transmission electron microscopy image is acquired while scanning (changing) the acquisition condition of the dark field transmission electron microscopy image, a crystal lattice interval range most reflected in the signal intensity of the dark field transmission electron microscopy image (in other words, most contributing to the generation of the image) may be obtained.

Figure 5:
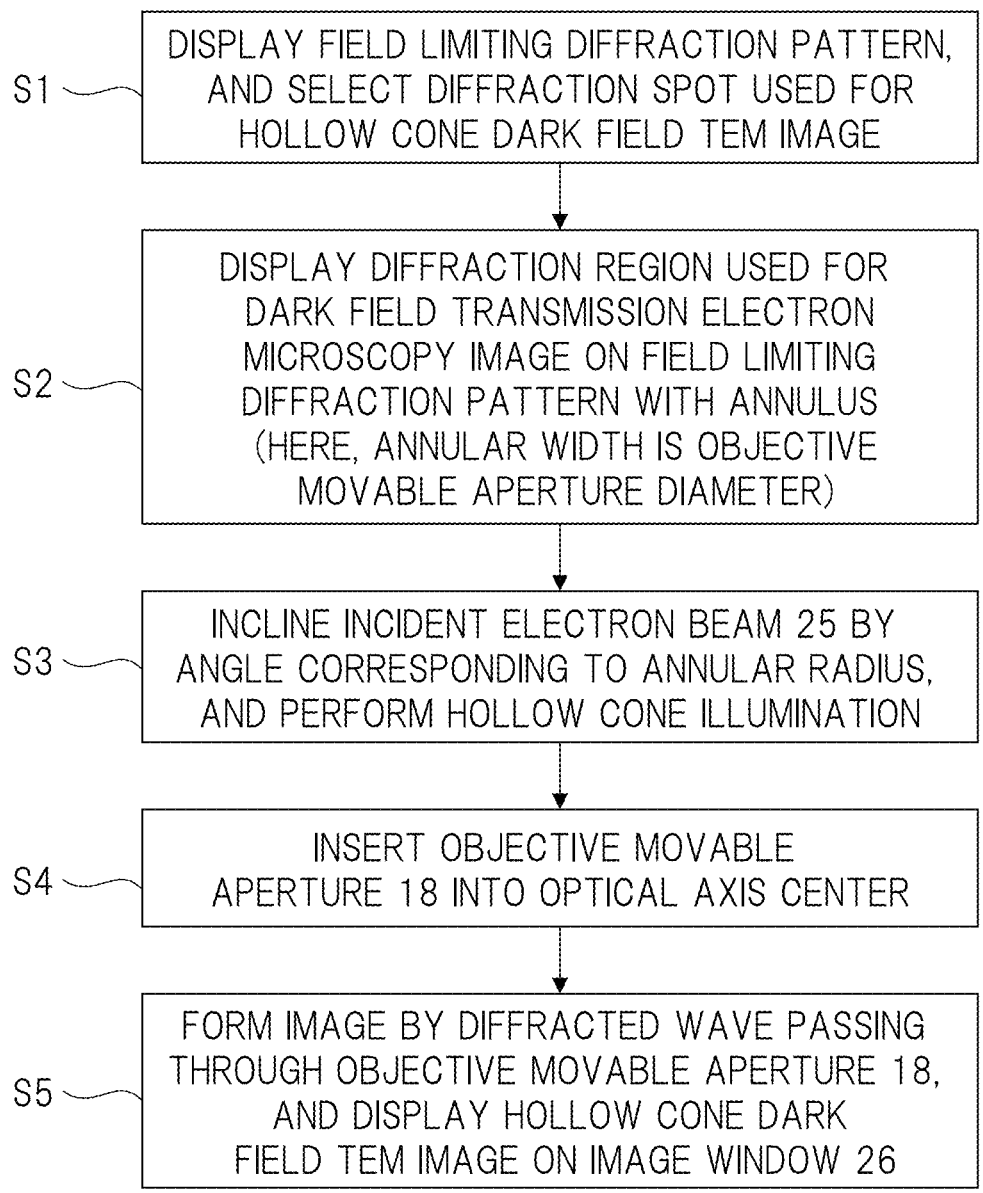
FIG. 5 is a flowchart showing an inspection method using the transmission electron microscope according to the first embodiment.

An inspection method using the transmission electron microscope 1 according to the first embodiment will be described with reference to FIGS. 5 and 6. FIG. 6 shows a display screen corresponding to steps S1 to S5 shown in FIG. 5.

<Step S1>

First, a field limiting diffraction pattern is captured in the hollow cone condition window 27. A diffraction spot having a crystal lattice plane interval to be used for the hollow cone dark field TEM image is selected by a marker 33. Here, the marker 33 has an arrow shape, whereas the shape of the marker 33 may be a circle having a diameter of the objective movable aperture 18 used for the hollow cone dark field TEM image.

<Step S2>

Coordinates of the selected diffraction spot are transmitted to the image control unit 14 in response to an instruction from the microprocessor 24. An origin of a coordinate system is, for example, the coordinates of the optical axis (main spot). The image control unit 14 displays the annular display 28 that has a width corresponding to the diameter of the objective movable aperture 18 input in advance and that has a radius corresponding to a distance between the optical axis (main spot) and the diffraction spot on the diffraction pattern. In the display of the annular display 28, information may be transmitted to the image control unit 14. Along with the annular display 28, the position of the cursor 30a of the scroll bar 30, the numerical value of the news box 31, and the button 32 are also displayed in conjunction with one another. The display of each of the annular display 28 and the like displayed in the hollow cone condition window 27 is displayed on the display unit 15.

<Step S3>

The microprocessor 24 inclines the electron beam 25 at an angle α corresponding to the radius R of the annular display 28, and issues an instruction to the deflection coil control unit 23 so as to perform hollow cone illumination on the sample 10. That is, the angle α of the precession of the electron beam 25 is determined by controlling the beam deflectors 22a and 22b based on the radius R of the annular display 28.

Here, the diffraction angle (α) is obtained by dividing a wavelength (λ) by the crystal plane interval d as shown in the following Formula (1). The crystal plane interval d is obtained by the following Formula (2) based on the radius R of the annular display 28 and a camera length L. Based on Formula (1) and Formula (2), it is understood that there is a relationship represented by the following Formula (3).

$$\alpha = \lambda/d \quad \text{Formula (1)}$$

$$dR = \lambda L \quad \text{Formula (2)}$$

$$R = L\alpha \quad \text{Formula (3)}$$

In response to the instruction from the deflection coil control unit 23, the beam deflectors 22a and 22b start the hollow cone illumination. On the back focal plane of the objective lens 4, each spot draws a circle with the specified radius R.

<Step S4>

When the microprocessor 24 issues an instruction to the movable aperture control unit 20 so as to place the objective movable aperture 18 at the optical axis center, the movable aperture control unit 20 inserts the objective movable aperture 18 into the optical axis center. Images corresponding to step S3 and step S4 shown in FIG. 6 do not necessarily need to be displayed.

<Step S5>

The electron beam 25 passing through the objective movable aperture 18 is image-formed by the objective lens 4. Thereafter, the electron beam 25 is enlarged by the intermediate lenses 5a and 5b and the projector lenses 6a and 6b. Finally, an image of the electron beam 25 is captured by the camera 13. A signal (image) output by the camera 13 is displayed on the image window 26 as the dark field transmission electron microscopy image by the image control unit 14 that receives the instruction from the microprocessor 24. Each condition when the dark field transmission electron microscopy image is obtained and the dark field transmission electron microscopy image are recorded in the image control unit 14 (image storage device 16).

In the above example, the diffraction spot group used for the hollow cone dark field TEM image is selected by the marker 33, whereas it is also possible to select the desired annular display 28 from the image displayed on the image window 26 by changing the position of the cursor 30a of the scroll bar 30 or changing the numerical value of the news box 31.

FIG. 7 shows an example of the display screen according to the first embodiment, and shows an example of an operation screen of the hollow cone dark field TEM image of the transmission electron microscope 1.

The example shown in FIG. 7 is suitable for observing, for example, a polycrystalline sample or an amorphous sample when a clear diffraction spot does not appear in the diffraction pattern and the diffraction pattern has a ring shape. However, even when the clear diffraction spot appears in the diffraction pattern, the application of the example in FIG. 7 is not hindered.

In the example described up to FIG. 6, a clear spot appears in the diffraction pattern. Therefore, it is easy for the user to select a diffraction spot used for generation of the dark field transmission electron microscopy image. However, as displayed in the hollow cone condition window 27 in FIG. 7, when the clear diffraction spot does not appear, it is difficult for the user to know what or where to select.

Therefore, in the example in FIG. 7, the image control unit 14 causes the following operations to be performed. First, a signal intensity line profile LI of the diffraction pattern is acquired. The signal intensity line profile LI is a linear profile starting from the position (the position of the optical axis) of the main spot of the diffraction pattern, and shows a distribution of the brightness of the diffraction pattern. That is, the signal intensity line profile LI is a curve that has a place where the brightness of the diffraction pattern is strong as a peak (apex) of a convex waveform and in which a plurality of convex waveforms are continuously connected. The signal intensity line profile LI may be displayed in the hollow cone condition window 27, may be displayed in another window, or may not be displayed.

In the example in FIG. 7, when the annular display 28 is set, first, the position of a maximum peak of the signal intensity line profile LI is set as a center (optical axis) of the diameter of the annular display 28. Then, a plurality of annular displays 28 are set for each peak such that the distance R from the set optical axis to the position of each peak is defined as a radius. An angle of the hollow cone illumination is determined by the set annular display 28. The position of the peak may be selected by the user. On the other hand, the image control unit 14 automatically determines the position of the peak, so that the plurality of annular displays 28 are automatically set for each peak, and the hollow cone dark field TEM image is automatically and sequentially acquired.

Here, the position of each peak is automatically determined by the image control unit 14 or the microprocessor 24, whereas the determination of the position of each peak may be performed by the user himself/herself.

When a lattice interval d to be acquired is determined in advance, R is obtained based on the relationship (R=Lλ/d) in the above Formula (2). Here, Lλ is a constant that is a product of the camera length L and the electron beam wavelength λ, and is obtained by a setting condition of the transmission electron microscope 1. In accordance with the calculated R, the annular display 28 may be automatically set, and the hollow cone dark field TEM image may be sequentially acquired.

Figure 8A:
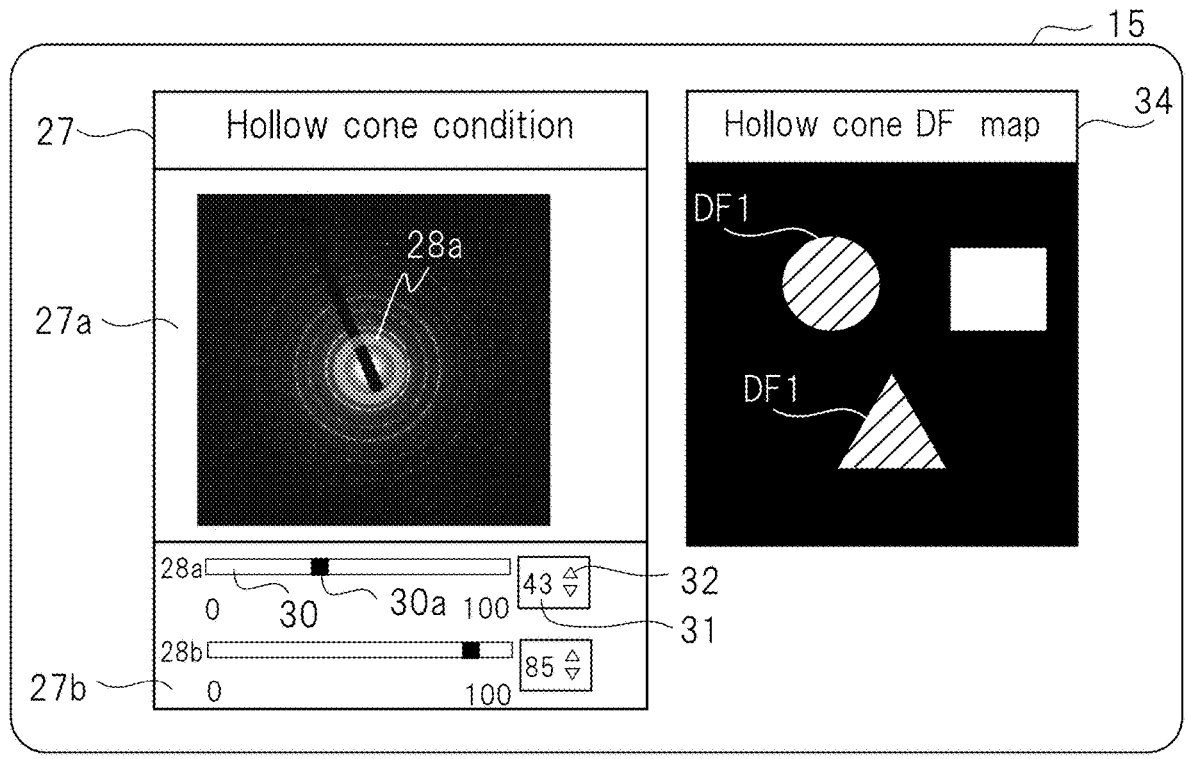
FIG. 8A shows an example of the display screen according to the first embodiment.
Figure 8B:
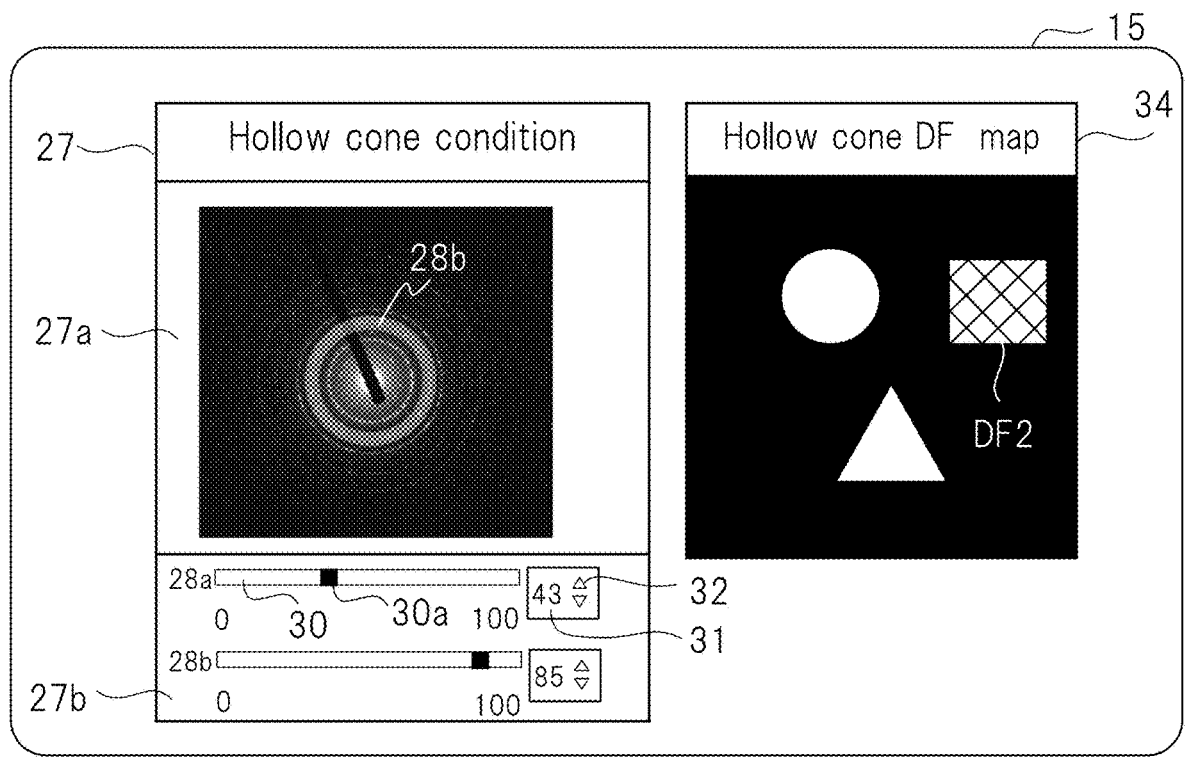
FIG. 8B shows an example of the display screen according to the first embodiment.

FIGS. 8A, 8B, and 8C show examples of the display screen according to the first embodiment, and show an example of the operation screen of the hollow cone dark field TEM image of the transmission electron microscope 1. In the examples in FIGS. 8A, 8B, and 8C, as in FIG. 7, the sample in which the diffraction spot does not clearly appear (the ring-shaped diffraction pattern appears) is used. However, the examples in FIGS. 8A, 8B, and 8C are not hindered from being applied to a sample in which the diffraction spot clearly appears.

In the examples in FIGS. 8A, 8B, and 8C, the image control unit 14 performs the following operations. First, as shown in FIG. 8A, a first annular display 28a used for the hollow cone dark field TEM image is designated in the hollow cone condition window 27. The designation may be executed by the user, or may be automatically executed by the image control unit 14 using the method described in FIG. 7 or the like. When the above designation is executed, in a hollow cone dark field window 34, a portion of the hollow cone dark field TEM image which contributes to the first annular display 28a becomes bright. For example, a dark field DF1 indicated by diagonal hatching becomes bright.

Next, as shown in FIG. 8B, when a second annular display 28b is designated, in the hollow cone dark field window 34, a portion of the hollow cone dark field TEM image which contributes to the second annular display 28b becomes bright. For example, a dark field DF2 indicated by a grid hatching in which diagonal lines in two different directions are combined becomes bright.

A contrast difference between the case in which the first annular display 28a is designated and the case in which the second annular display 28b is designated is derived from the fact that different diffracted waves contribute to generation of the dark field transmission electron microscopy image in both cases. Therefore, the example in FIG. 8 is useful for determining or estimating what kind of diffracted wave is generated from which portion of the sample. That is, the example in FIG. 8 is useful for determining or estimating the material and/or a crystal structure of any portion of the sample.

As shown in FIG. 8C, for example, a plurality of annular displays such as the first annular display 28a and the second annular display 28b described above are designated, and after each dark field transmission electron microscopy image corresponding to a respective one of the plurality of annular displays is captured, a mapping image in which a plurality of dark field transmission electron microscopy images are superimposed can be displayed on the display unit 15. Here, the dark field DF1 and the dark field DF2 are each indicated by individual hatching. However, in the actual display unit 15, the dark field DF1 and the dark field DF2 may be displayed in different colors such as blue and yellow. If there is a point where the dark field DF1 and the dark field DF2 superimpose, the point may be displayed by an intermediate color in which blue and yellow are mixed.

As described above, a distribution state of an observation field of each diffraction and scattering region can be known using the method described with reference to FIGS. 8A to 8C.

Figure 9A:
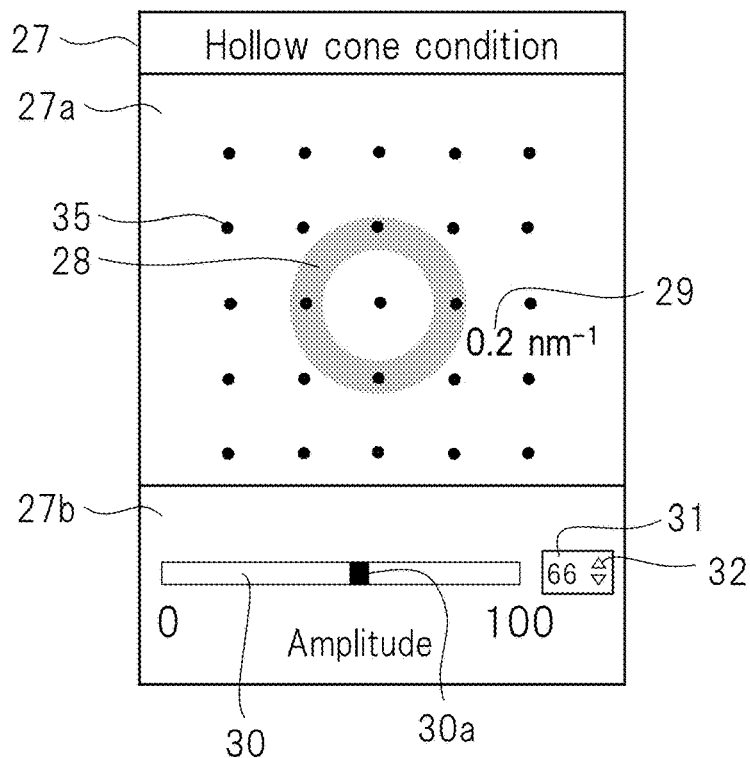
FIG. 9A shows an example of the display screen according to the first embodiment.
Figure 9B:
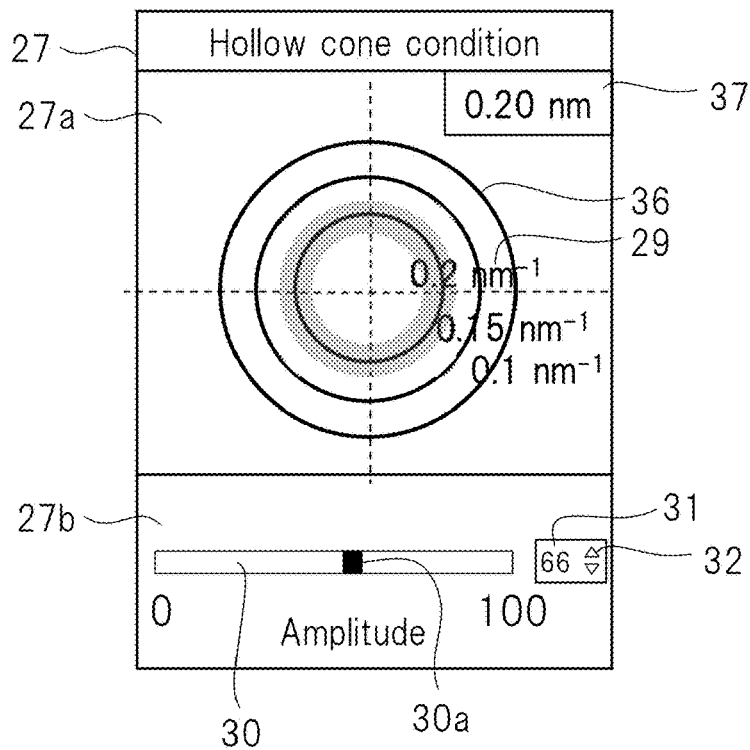
FIG. 9B shows an example of the display screen according to the first embodiment.

FIGS. 9A and 9B show examples of the display screen according to the first embodiment, and show an example of the operation screen of the hollow cone dark field TEM image of the transmission electron microscope 1. The cases described with reference to FIGS. 9A and 9B are suitable for the case in which the material of the sample to be inspected is known in advance, or the case in which the material of the sample is substantially estimated.

In the example in FIG. 9A, a diffraction pattern model 35 of a specific material input in advance in the image control unit 14 is displayed in the hollow cone condition window 27 instead of the acquired diffraction pattern. For example, by observing the amorphous sample 10 while heating the amorphous sample 10, it is possible to observe a process of a change in which crystallization occurs from the amorphous state.

In the hollow cone condition window 27, a diffraction pattern model of the sample 10 is displayed in advance, and a desired region is selected. Then, the intensity of the diffraction spot increases with the progress of crystallization. Although not shown here, the signal intensity of a crystallized portion of the hollow cone dark field TEM image increases in the image window 26, and the crystallized portion becomes bright, so that the crystallized portion can be observed more clearly than in the normal bright field transmission electron microscopy image.

Alternatively, as shown in FIG. 9B, instead of the acquired diffraction pattern, a ring scale 36 for each plane interval according to a camera length setting and the plane interval display 29 indicating the crystal plane interval of the above specific material may be displayed in the hollow cone condition window 27. A lattice interval d (reference numeral 37) corresponding to the annular display 28 is displayed on the upper right of the hollow cone condition window 27. When the position of the cursor 30a of the scroll bar 30 is automatically or manually changed, although not shown here, it is possible to know a crystal distribution having the crystal plane interval corresponding to the portion where an observation target portion becomes the brightest in the image window 26.

In the method in FIG. 9B, even when the material of the sample to be inspected is unknown, when the material of the sample is substantially estimated, the ring scale 36 and the plane interval display 29 are displayed in accordance with the conditions of the material. By doing so, when the material of the sample is as estimated, characteristics of the sample can be quickly specified, so that inspection time can be significantly reduced. Even if the material of the sample is not as estimated, at least the estimated material can be excluded from an inspection target. By displaying the ring scale 36 and the plane interval display 29, the user can know guidance of the condition at a glance, and therefore, it is possible to reduce the burden on the user.

Hereinafter, an inspection method using the transmission electron microscope 1 according to the first embodiment will be described with reference to FIG. 10. Since the details in steps S15 to S17 described below are substantially the same as the descriptions of steps S1 to S5 shown in FIG. 5 and FIG. 6 described above, descriptions thereof will be omitted here.

<Step S11>

First, the microprocessor 24 acquires, from each control unit, an acceleration voltage, a camera length, a size of the field limiting movable aperture 19, a size of the objective movable aperture 18, and a position of the sample 10, which are parameters necessary for acquiring the hollow cone dark field TEM image.

<Step S12>

Each lens system is switched so as to be in a mode for observing the field limiting diffraction pattern, and the field limiting diffraction pattern is displayed in the image window 26. The field limiting diffraction pattern is acquired and recorded in the display unit 15 and displayed in the hollow cone condition window 27. Here, the field limiting movable aperture 19 is inserted into a desired region, whereas the objective movable aperture 18 is not inserted. The optical axis (main spot) of the field limiting diffraction pattern is adjusted to be displayed at the center of the image window 26.

<Step S13>

The movable aperture control unit 20 inserts the objective movable aperture 18 into the position of the optical axis, that is, the center of the image window 26. The field limiting movable aperture 19 is controlled to be out of the field.

<Step S14>

The lens power supply control unit 8 switches the mode in which the field limiting diffraction pattern is observed to the image observation mode, and a bright field transmission electron microscopy image is displayed in the image window 26. This bright field transmission electron microscopy image is recorded in the image control unit 14 (image storage device 16).

<Step S15>

When the diffraction spot used for the hollow cone dark field TEM image is selected from the diffraction pattern displayed in the hollow cone condition window 27, the image control unit 14 sets the annular display 28, and the annular display 28 is displayed in the hollow cone condition window 27.

<Step S16>

The hollow cone illumination is started based on each condition of the annular display 28.

<Step S17>

The hollow cone dark field TEM image is displayed in the image window 26, the hollow cone dark field TEM image and capturing conditions (acceleration voltage, magnification, and the like) of the hollow cone condition window 27 are recorded in the image control unit 14 (image storage device 16).

<Step S18>

After a recording operation in step S17 is completed, the hollow cone illumination is stopped.

<Steps S19 to S21>

It is determined whether to end the operation or to further acquire another field. When acquisition of another field is not necessary, the processing moves to step S21 (No), and the inspection ends. For example, when only one field is recorded, or when the last recording among the recording of the plurality of fields is completed, the processing moves to step S21 (No). When the acquisition of another field is necessary, the processing moves to step S22 (Yes), and steps S14 to S19 are performed again.

The determination in step S19 may be performed by the user at the end of step S18, or may be set in advance such that recording of only one field or the plurality of fields is automatically executed.

When switching from a certain field to another field, the electron beam 25 is not illuminated to the sample 10 using the beam deflectors 21a and 21b or the beam deflectors 22a and 22b (blanking is performed). Accordingly, it is possible to prevent the sample 10 from being damaged by the illumination of the electron beam 25.

The operation setting of the beam deflectors 21a and 21b or the beam deflectors 22a and 22b may be executed at the time of switching the field such that the blanking is automatically performed.

Hereinafter, an inspection method using the transmission electron microscope 1 according to the first embodiment will be described with reference to FIG. 11. FIG. 11 shows the inspection method when the hollow cone dark field is acquired and recorded using the plurality of annular displays 28. In the following description, the description of the same places as those in FIG. 10 is omitted.

<Step S22>

For example, when the plurality of annular displays 28 are used, it is determined whether to change the annular display 28 after steps S11 to S18 shown in FIG. 11 are performed. For example, if the next annular display 28 having a different radius is to be used, the processing moves to step S15 (Yes), the next annular display 28 is reset, and steps S15 to S22 are performed again using the reset annular display 28. When all the annular displays 28 are used, the processing moves to step S23 (No).

Alternatively, after using a certain annular display 28, the radius of the annular display 28 is changed, and even when another dark field transmission electron microscopy image is obtained using the changed annular display 28, substantially the same steps are performed. Also in this case, the processing moves to step S15 (Yes), the next annular display 28 is reset, and steps S15 to S22 are performed again using the reset annular display 28.

At the time of resetting the annular display 28, the blanking is preferably performed in the same manner as in step S20 in FIG. 10. That is, since the angle of the precession of the electron beam 25 is changed by the resetting of the annular display 28, it is preferable that the electron beam 25 does not illuminate the sample 10 within the change period. Accordingly, it is possible to prevent the sample 10 from being damaged.

<Step S23>

In step S23, similarly to step S19 in FIG. 10, it is further determined whether the acquisition of another field is necessary. When the acquisition of another field is not necessary, the processing moves to step S25 (No), and the operation is ended. When the acquisition of another field is necessary, the processing moves to step S24 (Yes), and steps S14 to S23 are performed again.

The determination in step S23 may be executed by the user at the end of step S22, or may be set in advance such that recording of only one field or the plurality of fields is automatically performed.

Although the invention has been described in detail based on the embodiments, the invention is not limited to the embodiments described above, and various modifications can be made without departing from the scope of the invention. In the present application, the term "diameter" and "radius" appear, and the diameter has a value twice the radius. Therefore, "specifying a certain diameter" is equivalent to or equal to "specifying a certain radius", and vice versa.

REFERENCE SIGN LIST 1 transmission electron microscope (charged particle beam device)
2 electron gun
3 condenser lens 4 objective lens
5a, 5b intermediate lens
6a, 6b projector lens
7 lens excitation power supply
8 lens power supply control unit
9 sample holder
10 sample
11 sample micromotion control unit
12 fluorescent plate
13 camera
14 image control unit
15 display unit
16 image storage device
17 condenser movable aperture
18 objective movable aperture
19 field limiting movable aperture
20 movable aperture control unit
21a, 21b beam deflector (coil)
22a, 22b beam deflector (coil)
23 deflection coil control unit
24 microprocessor
25 electron beam
25a hollow cone-shaped electron beam
25b transmission electron beam
25c diffracted electron beam
26 image window
27 hollow cone condition window
27a display unit
27b condition setting unit
28, 28a, 28b annular display
29 plane interval display
30 scroll bar
30a cursor
31 news box
32 button
33 marker
34 hollow cone dark field window
35 diffraction pattern model
36 ring scale
37 lattice interval d
COL column
DE detection unit
DF1, DF2 dark field transmission electron microscopy image
LI signal intensity line profile
IM image-forming unit
RA irradiation unit

The invention claimed is:

1. A transmission electron microscope comprising:
an irradiation unit configured to irradiate a sample with an electron beam;
an objective lens configured to form an image of the electron beam transmitted through the sample;
a beam deflector that is located above a position at which the sample is to be positioned and that is configured to deflect the electron beam;
an objective aperture configured to pass only a part of the electron beam transmitted through the sample;
a detection unit configured to detect the electron beam transmitted through the sample; and
a control unit, wherein
the control unit controls a deflection angle of the electron beam by the beam deflector such that the sample is irradiated while the electron beam precesses at a predetermined angle with respect to an optical axis, and that only a diffracted wave and/or a scattered wave at a desired angle among diffracted waves and/or scattered waves generated by the electron beam passing through the sample passes through the objective aperture,
the control unit is capable of generating a dark field transmission electron microscopy image based on a detection signal in the detection unit of the diffracted wave and/or the scattered wave diffracted and/or scattered at a predetermined angle, and
the control unit displays, in a superimposed manner on a display unit electrically coupled to the detection unit, a diffraction pattern of the sample and an annular display that indicates a diffraction region and a scattering region used for generation of the dark field transmission electron microscopy image, that has a width corresponding to a diameter of the objective aperture, and that has a radius corresponding to an angle of precession of the electron beam.

2. The transmission electron microscope according to claim 1, wherein
an angle of the precession of the electron beam is changed by changing the radius of the annular display in the display unit.

3. The transmission electron microscope according to claim 2, wherein
the diffraction pattern includes a plurality of diffraction spots, and
the control unit controls a change in the angle of the precession of the electron beam such that the diffracted wave passing through the diffraction spot selected from the diffraction pattern passes through the objective aperture.

4. The transmission electron microscope according to claim 2, wherein
the electron beam is not applied to the sample during a period in which the angle of the precession of the electron beam is changed.

5. The transmission electron microscope according to claim 1, wherein
the control unit acquires a signal intensity line profile, the signal intensity line profile being a curve that has a place where brightness of the diffraction pattern is strong as a peak of a convex waveform and in which a plurality of the convex waveforms are continuously connected, sets a position of a maximum peak of the signal intensity line profile as an optical axis, and sets a plurality of annular displays for each peak such that a distance from the set optical axis to a position of each peak is a radius.

6. The transmission electron microscope according to claim 1, wherein
when a plurality of annular displays are displayed on the display unit, the control unit displays, in a superimposed manner on the display unit, a plurality of dark field transmission electron microscopy images corresponding to the plurality of annular displays.

7. The transmission electron microscope according to claim 1, wherein
the control unit displays, on the display unit, a diffraction pattern model of a specific material input in advance in the control unit.

8. The transmission electron microscope according to claim 7, wherein
the control unit also displays a crystal plane interval of the specific material on the display unit.

9. An inspection method using a transmission electron microscope including: an irradiation unit configured to irradiate a sample with an electron beam; an objective lens configured to form an image of the electron beam transmitted through the sample; a beam deflector that is located above a position at which the sample is to be positioned and that is configured to deflect the electron beam; an objective aperture configured to pass only a part of the electron beam transmitted through the sample; a detection unit configured to detect the electron beam transmitted through the sample; and a control unit, wherein the control unit controls a deflection angle of the electron beam by the beam deflector such that the sample is irradiated while the electron beam precesses at a predetermined angle with respect to an optical axis, and that only a diffracted wave and/or a scattered wave at a desired angle among diffracted waves and/or scattered waves generated by the electron beam passing through the sample passes through the objective aperture, the control unit is capable of generating a dark field transmission electron microscopy image based on a detection signal in the detection unit of the diffracted wave and/or the scattered wave diffracted and/or scattered at a predetermined angle, and the control unit displays, in a superimposed manner on a display unit electrically coupled to the detection unit, a diffraction pattern of the sample and an annular display that indicates a region used for generation of the dark field transmission electron microscopy image, that has a width corresponding to a diameter of the objective aperture, and that has a radius corresponding to an angle of precession of the electron beam; the transmission electron microscope being capable of providing the display unit inside or outside the transmission electron microscope, the inspection method comprising:

(a) a step of displaying, on the display unit, a diffraction pattern of the sample including a plurality of diffraction spots;

(b) a step of selecting a first diffraction spot from the diffraction pattern;

(c) a step of displaying, on the display unit, an annular display that has a width corresponding to a diameter of the objective aperture and that has a diameter corresponding to twice a distance between the optical axis and the first diffraction spot;

(d) a step of determining an angle of precession of the electron beam by controlling the beam deflector based on a radius of the annular display;

(e) a step of irradiating the sample with the electron beam after the step (d);

(f) a step of inserting the objective aperture into a center of the optical axis after the step (e); and (g) a step of generating the dark field transmission electron microscopy image in the control unit based on a detection signal of the diffracted wave obtained by the detection unit and displaying the generated dark field transmission electron microscopy image on the display unit after the step (f).

10. The inspection method using the transmission electron microscope according to claim 9, wherein
after the step (g), the processing moves to the step (c), the radius of the annular display is reset, and the steps (c) to (g) are performed again using the reset annular display.

11. A transmission electron microscope that irradiates a sample while causing an electron beam to precess, and that generates a dark field transmission electron microscopy image using a part of a diffracted wave and/or a scattered wave transmitted through the sample, the transmission electron microscope comprising:
a graphical user interface that includes at least a pattern of the diffracted wave and/or the scattered wave of the sample and an annular display of a diffraction region and a scattering region used for generation of the dark field transmission electron microscopy image displayed in a superimposed manner on the pattern of the diffracted wave and/or the scattered wave, wherein
a region used for generation of the dark field transmission electron microscopy image is determined by specifying a diameter of the annular display.

12. A transmission electron microscope comprising:
an electron source;
an irradiation unit configured to irradiate a sample with an electron beam along a hollow cone;
a detection unit to which a diffracted wave and/or a scattered wave from the sample is irradiated; and
a graphical user interface including at least a first region in which a dark field transmission electron microscopy image is output by the detection unit and a second region in which an image corresponding to a pattern of the diffracted wave and/or the scattered wave is displayed, wherein
the detection unit detects the diffracted wave and/or the scattered wave corresponding to a region inside an annular display that is displayed in the second region and centered on an optical axis, and outputs the dark field transmission electron microscopy image to the first region, and
the first region and the second region are interlocked with each other such that changing a condition in the second region automatically changes the condition in the first region.

* * * * *